United States Patent
Tan et al.

(10) Patent No.: US 11,216,130 B2
(45) Date of Patent: Jan. 4, 2022

(54) TOUCH DISPLAY PANEL AND METHOD FOR PREPARING THE SAME

(71) Applicants: Chengdu BOE Optoelectronics Technology Co., Ltd., Sichuan (CN); BOE Technology Group Co., Ltd., Beijing (CN)

(72) Inventors: Wen Tan, Beijing (CN); Fei Yu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/909,990

(22) Filed: Jun. 23, 2020

(65) Prior Publication Data

US 2021/0004123 A1    Jan. 7, 2021

(30) Foreign Application Priority Data

Jul. 3, 2019   (CN) .......................... 201910593649.1

(51) Int. Cl.
G06F 3/044   (2006.01)
G06F 3/041   (2006.01)
H01L 27/12   (2006.01)

(52) U.S. Cl.
CPC .......... *G06F 3/0443* (2019.05); *G06F 3/0412* (2013.01); *H01L 27/1222* (2013.01); *H01L 27/1259* (2013.01)

(58) Field of Classification Search
CPC . G06F 3/0443; G06F 3/0412; H01L 27/1222; H01L 27/1259
See application file for complete search history.

(56) References Cited

U.S. PATENT DOCUMENTS

2015/0248186 A1* 9/2015 Oh ........................ G06F 3/0446
                                                    345/174
2017/0090636 A1* 3/2017 Ding ..................... G06F 3/0412
2020/0258959 A1* 8/2020 Mao .................... H01L 51/0026

* cited by examiner

*Primary Examiner* — Robert J Michaud
(74) *Attorney, Agent, or Firm* — Ling Wu; Stephen Yang; Ling and Yang Intellectual Property

(57) ABSTRACT

Provided are a touch display panel and a method for preparing the touch display panel. The touch display panel includes a base substrate, a display substrate disposed on the base substrate, and a touch substrate disposed on the display substrate, wherein the display substrate comprises a plurality of pixel units arranged in a matrix, the pixel units each comprise a plurality of sub-pixels, the touch substrate comprises a touch electrode layer, the touch electrode layer comprises a plurality of hollow regions, and an orthographic projection of a hollow region on the base substrate contains an orthographic projection of at least one sub-pixel or at least one pixel unit on the base substrate.

18 Claims, 6 Drawing Sheets

TOUCH DISPLAY PANEL AND METHOD FOR PREPARING THE SAME

CROSS-REFERENCE TO RELATED APPLICATION

The present application claims the priority of Chinese Patent Application No. 201910593649.1 filed to the CNIPA on Jul. 3, 2019, the content of which is hereby incorporated by reference.

TECHNICAL FIELD

The present disclosure relates to, but is not limited to the technical field of display, in particular to a touch display panel and a method for preparing the same.

BACKGROUND

With rapid development of display technology, touch screen panel (TSP) has gradually spread throughout people's lives. According to a composition structure, the touch screen panel may be classified as types of Add on Mode, On Cell, In Cell, etc. For the In Cell type, touch electrodes of a touch screen panel is embedded in a display panel, which can not only reduce overall thickness of the module, but also reduce manufacturing cost of the touch screen panel.

Capacitive touch technology is adopted in the In Cell type of the touch screen panel, and the capacitive touch technology is mainly classified as a mutual-capacitance structure and a self-capacitance structure. The self-capacitance structure includes a plurality of touch electrodes which are arranged on the same layer and are insulated from each other, the touch electrodes are connected with a driving circuit through wires, capacitance changes of the touch electrodes are caused when the touch electrodes are touched, and the driving circuit can determine the touch position according to the capacitance changes. Compared with the mutual capacitance structure, the self-capacitance structure is a single-layer electrode structure, has the advantages of a simple structure, low cost and the like, and is widely applied to small-size wearable products, such as a watch with touch and display functions.

SUMMARY

The following is a summary of subject matter described in detail herein. The summary is not intended to limit the protection scope of the claims.

A touch display panel includes a base substrate, a display substrate disposed on the base substrate, and a touch substrate disposed on the display substrate, wherein the display substrate includes a plurality of pixel units arranged in a matrix, the pixel units each include a plurality of sub-pixels, the touch substrate includes a touch electrode layer, the touch electrode layer includes a plurality of hollow regions, and an orthographic projection of a hollow region on the base substrate contains an orthographic projection of at least one sub-pixel on the base substrate, or an orthographic projection of a hollow region on the base substrate contains an orthographic projection of at least one pixel unit on the base substrate.

In an exemplary embodiment, the display substrate further includes a plurality of photo spacers, and an orthographic projection of a hollow region on the base substrate contains an orthographic projection of a photo spacer on the base substrate.

In an exemplary embodiment, a distance between a boundary of the orthographic projection of the hollow region on the base substrate and a boundary of the orthographic projection of the at least one sub-pixel, the at least one pixel unit or the photo spacer on the base substrate is about 5 μm to 8 μm.

In an exemplary embodiment, the touch electrode layer further includes a physical region located between the hollow regions, and a width of the physical region is about 4 μm to 6 μm.

In an exemplary embodiment, at least one shin is disposed in the hollow region, and the at least one shin is a strip-shaped physical body extending from an edge of the hollow region to a middle of the hollow region.

In an exemplary embodiment, four shins are disposed in the hollow region, and the four shins are respectively located between adjacent emitting units and between an emitting unit and a photo spacer.

In an exemplary embodiment, a material of the touch electrode layer includes any one or more of molybdenum and aluminum.

In an exemplary embodiment, the display substrate includes a thin film transistor, a scanning line, a shielding layer surrounding an active display region, and a common electrode connected with the shielding layer through a connection electrode, which are disposed on the base substrate, and the shielding layer, the connection electrode and the common electrode form shield to the scanning line.

In an exemplary embodiment, the shielding layer includes a first shielding layer surrounding the active display region, and a second shielding layer surrounding the first shielding layer, and the first shielding layer is connected with the common electrode through the connection electrode.

In an exemplary embodiment, a material of the first shielding layer and the second shielding layer includes polycrystalline silicon, and the first shielding layer and the second shielding layer are disposed on a same layer as an active layer of the thin film transistor, and the material of the first shielding layer and the second shielding layer is same as that of the thin film transistor.

In an exemplary embodiment, the touch substrate further includes a touch insulating layer disposed on the touch electrode layer and a touch contact electrode layer disposed on the touch insulating layer, the touch insulating layer is provided with a plurality of vias, and the plurality of vias are configured to connect the touch contact electrode layer with the touch electrode layer, and are further configured to release gas and stress when the touch contact electrode layer is overlapped with a contact electrode of the display substrate.

In an exemplary embodiment, vias provided in an active display region are configured to connect the touch contact electrode layer with the touch electrode layer, and vias provided in an overlapping region are configured to release gas and stress when the touch contact electrode layer is overlapped with the contact electrode of the display substrate; and a plurality of vias in the overlapping region are disposed around the overlapping region, and the plurality of vias form an annular via region.

A method for preparing a touch display panel includes: forming a display substrate including a plurality of pixel units arranged in a matrix on a base substrate, and forming a touch substrate including a touch electrode layer; wherein the pixel units each includes a plurality of sub-pixels, and the touch electrode layer includes a plurality of hollow regions; and disposing the touch substrate on the display substrate, so that an orthographic projection of a hollow region on the base substrate contains an orthographic projection of at least one sub-pixel on the base substrate, or an orthographic projection of a hollow region on the base substrate contains an orthographic projection of at least one pixel unit on the base substrate.

In an exemplary embodiment, the formed display substrate further includes a plurality of photo spacers, and when the touch substrate is disposed on the display substrate, an orthographic projection of a hollow region on the base substrate further contains an orthographic projection of a photo spacer on the base substrate.

In an exemplary embodiment, at least one shin is disposed in the hollow region, and at least one shin is a strip-shaped physical body extending from an edge of the hollow region to a middle of the hollow region.

In an exemplary embodiment, four shins are disposed in the hollow region, and the four shins are respectively located between adjacent emitting units and between an emitting unit and a photo spacer.

In an exemplary embodiment, forming the display substrate including the plurality of pixel units arranged in the matrix on the base substrate includes: forming, on the base substrate, a thin film transistor, a scanning line, a shielding layer surrounding an active display region, and a common electrode connected with the shielding layer through a connection electrode, wherein the shielding layer, the connection electrode and the common electrode form shield to the scanning line.

In an exemplary embodiment, forming, on the base substrate, the thin film transistor, the scanning line, the shielding layer surrounding the active display region, and the common electrode connected with the shielding layer through the connection electrode includes: forming, on the base substrate, an active layer of the thin film transistor, a first shielding layer surrounding the active display region and a second shielding layer surrounding the first shielding layer through a same patterning process; forming a first insulating layer covering the active layer, the first shielding layer and the second shielding layer, and a gate electrode disposed on the first insulating layer; forming a second insulating layer covering the gate electrode, and the common electrode and the scanning line disposed on the second insulating layer; forming a third insulating layer covering the common electrode and the scanning line, wherein the third insulating layer is provided with a first via exposing the active layer, a second via exposing the common electrode and a third via exposing the first shielding layer; and forming a source electrode, a drain electrode and a connection electrode on the third insulating layer, wherein the source electrode and the drain electrode are respectively connected with the active layer through the first via, the connection electrode is connected with the common electrode through the second via, and the connection electrode is connected with the first shielding layer through the third via.

In an exemplary embodiment, forming the touch substrate including the touch electrode layer includes: forming the touch electrode layer including the plurality of hollow regions on a touch base substrate, wherein a material of the touch electrode layer includes molybdenum or aluminum; forming a touch insulating layer on the touch electrode layer, wherein the touch insulating layer is provided with a plurality of vias, and the plurality of vias are configured to release gas and stress when a touch contact electrode layer is overlapped with a contact electrode of the display substrate; and forming the touch contact electrode layer on the touch insulating layer, wherein the touch contact electrode layer is connected with the touch electrode layer through the plurality of vias.

In an exemplary embodiment, vias formed in an active display region are configured to connect the touch contact electrode layer with the touch electrode layer, and vias formed in an overlapping region are configured to release gas and stress when the touch contact electrode layer is overlapped with the contact electrode of the display substrate; and a plurality of vias in the overlapping region are formed around the overlapping region, and the plurality of vias form an annular via region.

Other aspects will become apparent upon reading and understanding the drawings and detailed description.

BRIEF DESCRIPTION OF DRAWINGS

Accompanying drawings are used for providing a further understanding of technical solutions of the present disclosure and form a part of the specification. Together with embodiments of the present application, the accompanying drawings are used for explaining technical solutions of the present disclosure and do not constitute a limitation on the technical solutions of the present disclosure. Shapes and sizes of the components in the drawings do not reflect real proportions, and are only for the purpose of schematically illustrating contents of the present disclosure.

DESCRIPTION OF THE REFERENCE SIGNS

Figure 1:
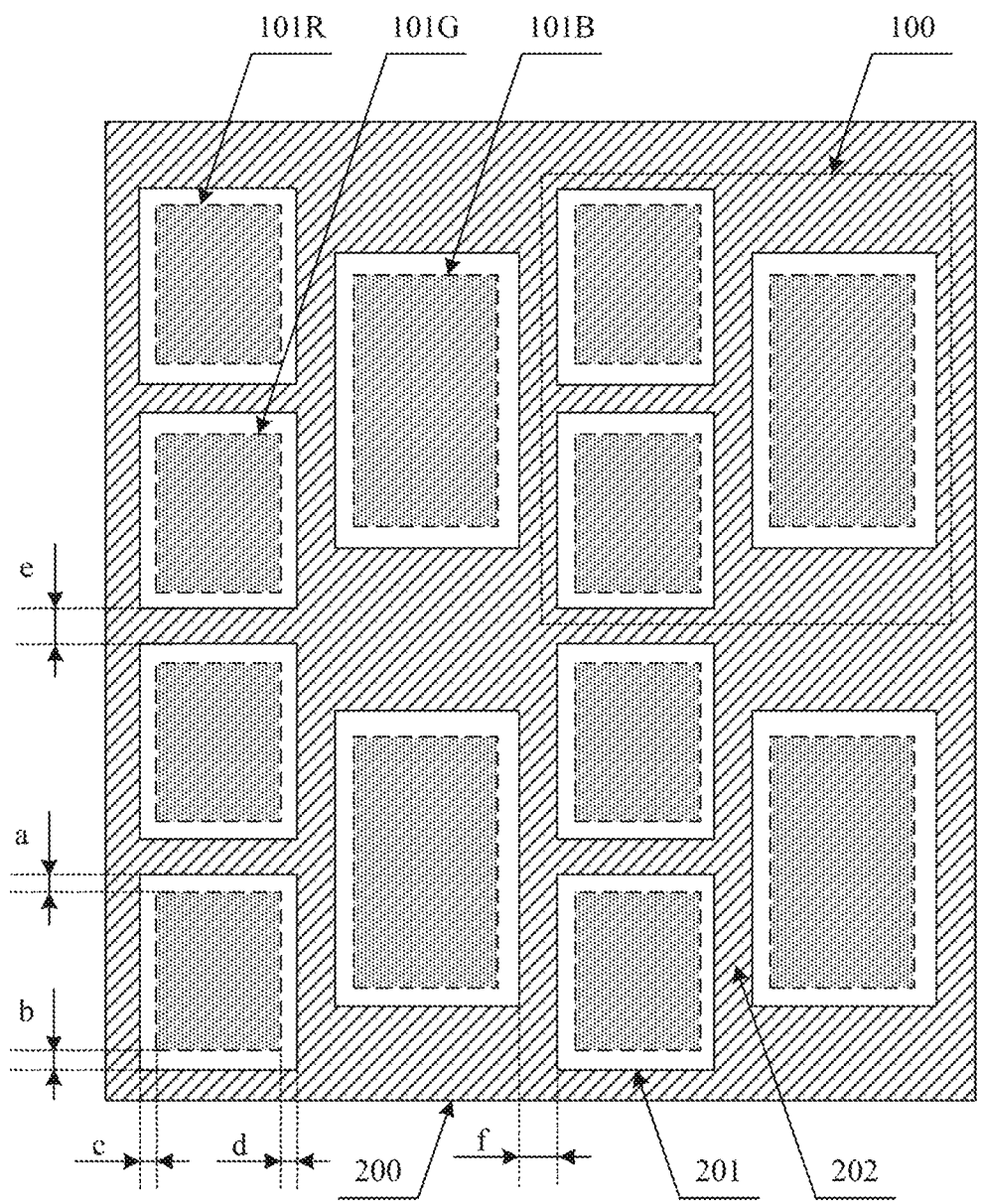
FIG. 1 is a schematic plan view of a touch display panel according to the present disclosure.

10—Base Substrate;
11—Buffer Layer;
12—First Shielding Layer;
13—Second Shielding Layer;
14—Common Electrode;
15—Connection Electrode;
20—Driving Structure Layer;
30—Packaging Layer;
40—Scanning Line;
50—Contact Electrode;
100—Pixel Unit;
101—Emitting Unit;
101R—Red Emitting Unit;
101G—Green Emitting Unit;

101B—Blue Emitting Unit;
200—Touch Electrode Layer;
201—Hollow Region;
202—physical Region;
203—IM Layer;
204—Touch Insulating Layer;
204a—Via;
205—Touch Contact Electrode Layer.

DETAILED DESCRIPTION

Embodiments herein may be implemented in multiple different forms. One of ordinary skill in the art can easily understand a fact that implementation modes and implementation contents can be changed into various forms without departing from the principle and scope of the present disclosure. Therefore, the present disclosure should not be construed to be limited only to what is described in the following embodiments. The embodiments in the present disclosure and the features in the embodiments may be combined with each other arbitrarily without a conflict.

In small-sized wearable products, to ensure good transparency, a touch electrode is usually made of indium tin oxide (ITO) and designed as a block shape. Researches found that such a touch electrode structure has a problem of its large capacitance. Due to its large capacitance, a signal-to-noise ratio (SNR) of a touch response is small. In this case, not only selection of a touch and display driver integration (TDDI) IC with a higher quality is required, which increases the production cost, but also a touch signal is easily interfered by external signals, which reduces working reliability.

The present disclosure provides a touch display panel including a base substrate, a display substrate disposed on the base substrate, and a touch substrate disposed on a surface of a side of the display substrate remote from the base substrate. The display substrate includes a plurality of pixel units arranged in a matrix, each pixel unit includes three emitting units emitting light of different colors (such as red, green and blue), or four emitting units emitting light of different colors (such as red, green, blue and white), and each emitting unit serves as one sub-pixel. The touch substrate includes a touch electrode layer, and the touch electrode layer is grid-shaped and includes a plurality of hollow regions and a physical region located between hollow regions. A position of a hollow region corresponds to a position of at least one sub-pixel of the display substrate, and an orthographic projection of the hollow region on the base substrate contains an orthographic projection of at least one sub-pixel on the base substrate. Optionally, a position of a hollow region corresponds to a position of at least one pixel unit of the display substrate, and an orthographic projection of the hollow region on the base substrate contains an orthographic projection of at least one pixel unit on the base substrate.

The touch display panel provided by the present disclosure not only can reduce the self capacitance of the touch electrode, improve the signal-to-noise ratio of the touch response, be beneficial to the selection of the TDDI IC, and reduce the production cost, but also can reduce interference caused by external signals and increase the working reliability.

Figure 2:
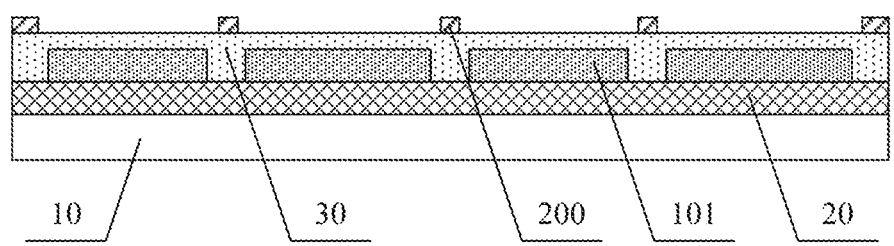
FIG. 2 is a schematic cross-sectional view of a touch display panel according to the present disclosure.

FIG. 1 is a schematic plan view of a touch display panel according to the present disclosure, and FIG. 2 is a schematic cross-sectional view of a touch display panel according to the present disclosure. As shown in FIGS. 1 and 2, in an exemplary embodiment, the touch display panel may include a base substrate 10, a display substrate disposed on the base substrate 10, and a touch substrate disposed on the display substrate, i.e., the display substrate and the touch substrate are stacked structures disposed on the base substrate 10. In a plane parallel to the base substrate 10, the display substrate may include a plurality of pixel units 100 arranged in a matrix, each pixel unit 100 may include three emitting units 101 emitting light of different colors, namely, a red emitting unit 101R, a green emitting unit 101G and a blue emitting unit 101B. The three emitting units may be arranged in a layout like the Chinese character "Z", the red emitting unit 101R and the green emitting unit 101G are arranged up-down in a column direction, and the red emitting unit 101R and the green emitting unit 101G and the blue emitting unit 101B are arranged left-right in a row direction. An area of the blue emitting unit 101B may be about twice that of the red emitting unit 101R (or the green emitting unit 101G), so that the blue emitting unit 101B may be shared by the red emitting unit 101R and the green emitting unit 101G in adjacent columns. The touch substrate may include a touch electrode layer 200, and the touch electrode layer 200 is grid-shaped and may include a plurality of hollow regions 201 and a physical region 202 located between the hollow regions 201. In an exemplary embodiment, one hollow region 201 of the touch substrate corresponds to one emitting unit 101 (the red emitting unit 101R, the green emitting unit 101G, or the blue emitting unit 101B) of the display substrate, and an area of the hollow region 201 is greater than or equal to an area of the corresponding emitting unit 101, i.e., one hollow region 201 of the touch substrate exposes one emitting unit 101 of the display substrate. In a plane perpendicular to the base substrate 10, the display substrate may include a driving structure layer 20 disposed on the base substrate 10, emitting units 101 disposed on the driving structure layer 20, and a packaging layer 30 covering the emitting units 101. The driving structure layer 20 may mainly include a plurality of thin film transistors (TFTs), each emitting unit 101 may include an anode, an organic emitting layer, and a cathode, and each emitting unit forms a light emitting region. The touch electrode layer 200 may be disposed on the packaging layer 30, and a hollow region is formed at a corresponding position of each emitting unit 101. An orthographic projection of the hollow region on the base substrate contains an orthographic projection of the corresponding emitting unit on the base substrate, so that the plurality of hollow regions 201 of the touch substrate expose the plurality of emitting units 101 of the display substrate.

In the present disclosure, the orthographic projection of the hollow region on the base substrate contains the orthographic projection of the corresponding emitting unit on the base substrate, which means that a boundary of the orthographic projection of the hollow region on the base substrate completely coincides with a boundary of the orthographic projection of the corresponding emitting unit on the base substrate, or a boundary of the orthographic projection of the hollow region on the base substrate is located outside a boundary of the orthographic projection of the corresponding emitting unit on the base substrate.

In an exemplary embodiment, a material of the touch electrode layer may include metal, an area resistance of the metal material is smaller than that of the ITO, and a metal electrode requires a smaller RC load of the TDDI IC, which can reduce the quality requirement on the TDDI IC and facilitate the selection of the TDDI IC. In terms of a preparation process, a difficulty of hollowing out the metal material is lower than that of hollowing out the ITO, thus the difficulty of the preparation process is reduced. In an exemplary embodiment, the touch electrode layer is made of a material of molybdenum (Mo) with a small area resistance and a good antioxidant property. In an exemplary embodiment, the touch electrode layer may be made of a material of another metal, such as aluminum (Al). Considering the poor antioxidant property of the aluminum material, a corresponding inorganic protective layer, such as silicon oxide (SiOx), may be added.

In an exemplary embodiment, it may be set that the area of the hollow region is larger than the area of the corresponding emitting unit. In an exemplary embodiment, the boundary of the emitting unit (the boundary of the orthographic projection of the emitting unit on the base substrate) may be extended outward by a certain distance as the boundary of the hollow region. As shown in FIGS. 1 and 2, in a column direction, an upper boundary of the hollow region is extended upward by a distance a from an upper boundary of the emitting unit, and a lower boundary of the hollow region is extended downward by a distance b from a lower boundary of the emitting unit. In a row direction, a left boundary of the hollow region is extended leftward by a distance c from a left boundary of the emitting unit, and a right boundary of the hollow region is extended rightward by a distance d from a right boundary of the emitting unit. Considering the requirements of alignment, process margin, etc., the extension distances may be set as follows: a is about 5 μm to 8 μm, b is about 5 μm to 8 μm, c is about 5 μm to 8 μm, and d is about 5 μm to 8 μm. In an exemplary embodiment, a distance e (a width of the physical region) between two hollow regions in the column direction and a distance f (a width of the physical region) between two hollow regions in the row direction only need meet a requirement of a minimum process margin in the preparation process. In an exemplary embodiment, it may be set that the expansion distance of each hollow region is the same, or an expansion distance of the hollow region corresponding to the blue emitting unit 101B is slightly larger, and expansion distances of the hollow regions corresponding to the red emitting unit 101R and the green emitting unit 101G are slightly smaller. In an exemplary embodiment, it may be set that a=b, c=d, or a=b=c=d. In this document, "about" refers to not strictly limiting a demarcation line, and allowing a value within a process and measurement error range.

According to the present disclosure, the touch electrode layer is set to be grid-shaped and includes the plurality of hollow regions exposing the emitting units of the display substrate, so that not only the self capacitance of the touch electrode is effectively reduced, but also optical characteristics of the emitting units are ensured. The reduction of the self capacitance of the touch electrode can improve the signal-to-noise ratio of the touch response, reduce the requirements on the TDDI IC, and expand a range of the selection of the TDDI IC, thus effectively reducing the production cost. The touch electrode is made of a metallic material, and the quality requirements on the TDDI IC is further reduced by reducing the area resistance of the touch electrode. Therefore, the difficulty of the preparation process is reduced, and the process has a good feasibility.

Figure 3:
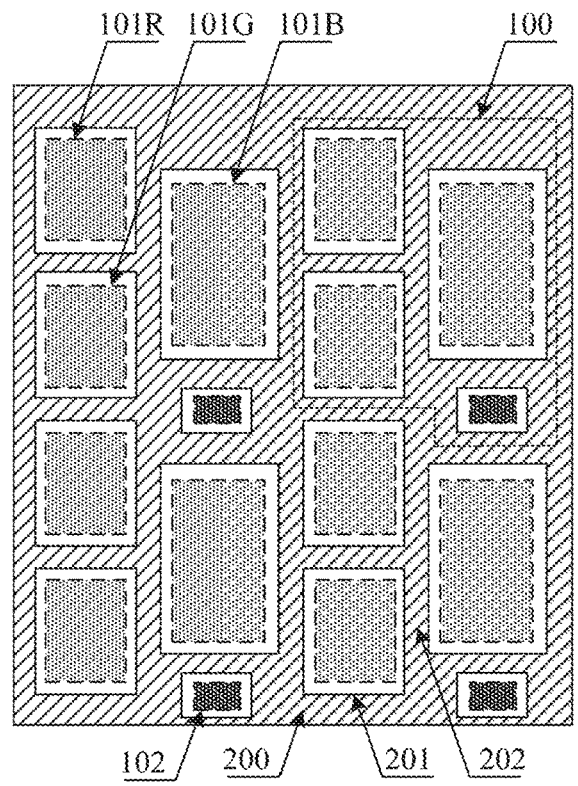
FIG. 3 is a schematic structural diagram of another touch display panel according to the present disclosure.

FIG. 3 is a schematic structural diagram of another touch display panel according to the present disclosure. As shown in FIG. 3, other structures of the touch display panel in this embodiment are similar to the corresponding structures described in the foregoing embodiments. Unlike the foregoing embodiments, the display substrate is also provided with a plurality of photo spacers (PSs) 102, the blue emitting units 101B and the photo spacers 102 are arranged up-down in the column direction, and each photo spacer 102 is disposed between adjacent blue emitting units 101B. A hollow region 201 on the touch electrode layer 200 corresponds to a photo spacer 102 of the display substrate, and an area of the hollow region 201 is greater than or equal to an area of the corresponding photo spacer 102. An orthographic projection of the hollow region 201 on the base substrate contains an orthographic projection of the photo spacer 102 on the base substrate, and the plurality of hollow regions 201 of the touch substrate expose the plurality of photo spacers 102 of the display substrate.

In an exemplary embodiment, it may be set that the area of the hollow region is larger than the area of the corresponding photo spacer, that is, a boundary of the photo spacer is extended outward by a certain distance as a boundary of the hollow region. Similar to the boundary extension in the foregoing embodiment, in the column direction, an upper boundary of the hollow region is extended upward by a distance a' from an upper boundary of the photo spacer, and a lower boundary of the hollow region is extended downward by a distance b' from a lower boundary of the photo spacer. In the row direction, a left boundary of the hollow region is extended leftward by a distance c' from a left boundary of the photo spacer, and a right boundary of the hollow region is extended rightward by a distance d' from a right boundary of the photo spacer. In an exemplary embodiment, a' is about 5 μm to 8 μm, b' is about 5 μm to 8 μm, c' is about 5 μm to 8 μm, and d' is about 5 μm to 8 μm. In an exemplary embodiment, a distance e' between two hollow regions in the column direction and a distance f' between two hollow regions in the row direction only need meet a requirement of a minimum process margin in the preparation process. In an exemplary embodiment, it may be set that a'=b', c'=d', or a'=b'=c'=d'.

In an exemplary embodiment, a hollowing-out design may be performed according to the minimum width of the physical region 202 between the hollow regions 201, and the minimum width of the physical region 202 is a width meeting the minimum process margin in the preparation process. For example, a distance between a hollow region corresponding to a red emitting unit 101R and a hollow region corresponding to a green emitting unit 101G locating below the red emitting unit 101R is e1, a distance between a hollow region corresponding to a green emitting unit 101G and a hollow region corresponding to a red emitting unit 101R locating below the green emitting unit 101G is e2, and a distance between a hollow region corresponding to a blue emitting unit 101B and a hollow region corresponding to a photo spacer 102 locating below (or above) the blue emitting unit 101B is e3, it may be set that e1=e2=e3, i.e., widths of physical regions 202 between the hollow regions 201 are the same width. According to the same width, the boundaries of various hollow regions may be determined, i.e., outward expansion distances a-d of each emitting unit and outward expansion distances a'-d' of each photo spacer may be determined. In an exemplary embodiment, the minimum width of the physical region may be set to about 4 μm to 6 μm considering the minimum process margin in the preparation process.

According to the present disclosure, the self capacitance of the touch electrode can be further reduced by further disposing the hollow regions at the positions of the photo spacers.

Figure 4:
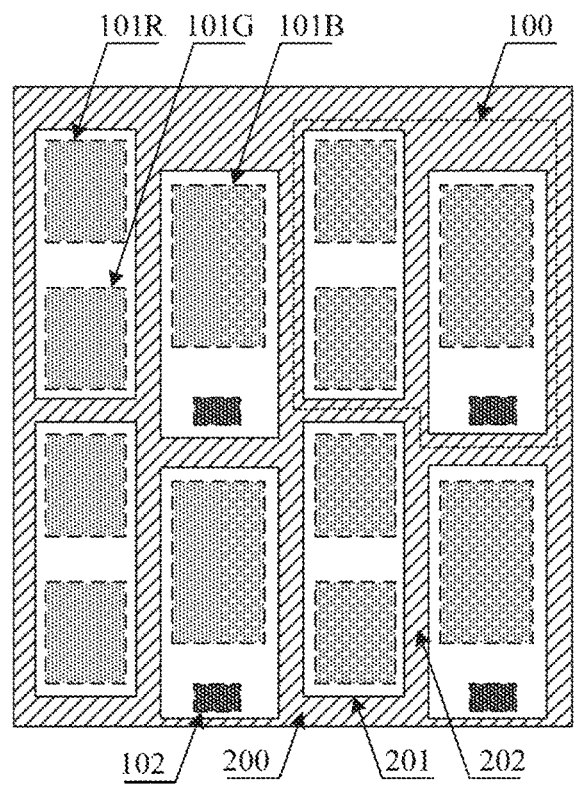
FIG. 4 is a schematic structural diagram of still another touch display panel according to the present disclosure.

FIG. 4 is a schematic structural diagram of still another touch display panel according to the present disclosure. As shown in FIG. 4, other structures of the touch display panel in this embodiment are similar to the corresponding structures described in the foregoing embodiments. Unlike the foregoing embodiments, one hollow region 201 of the touch substrate corresponds to two emitting units (red emitting unit 101R and green emitting unit 101G) of the display substrate, and an area of the hollow region 201 is greater than or equal to that of the corresponding two emitting units, and one hollow region 201 corresponds to one emitting unit (blue emitting unit 101B) and one photo spacer 102 of the display substrate, and an area of the hollow region 201 is greater than or equal to that of the corresponding emitting unit and photo spacer.

In an exemplary embodiment, the hollow regions may be designed in a way of the foregoing embodiments, i.e., the widths of the physical regions between the hollow regions are set to be the same width (about 4 μm to 6 μm), and the boundaries of various hollow regions are determined according to the same width. In other words, the determination of the distances by which the boundaries of the emitting unit and the photo spacer are extended outward and the expansion way are the same as those of the foregoing embodiments, and will not be repeated here.

According to the present disclosure, a hollow region corresponds to two emitting units or one emitting unit and one photo spacer, so that the self capacitance of the touch electrode can be further reduced, and the structure of the grid-shaped touch electrode layer can be simplified.

Figure 5:
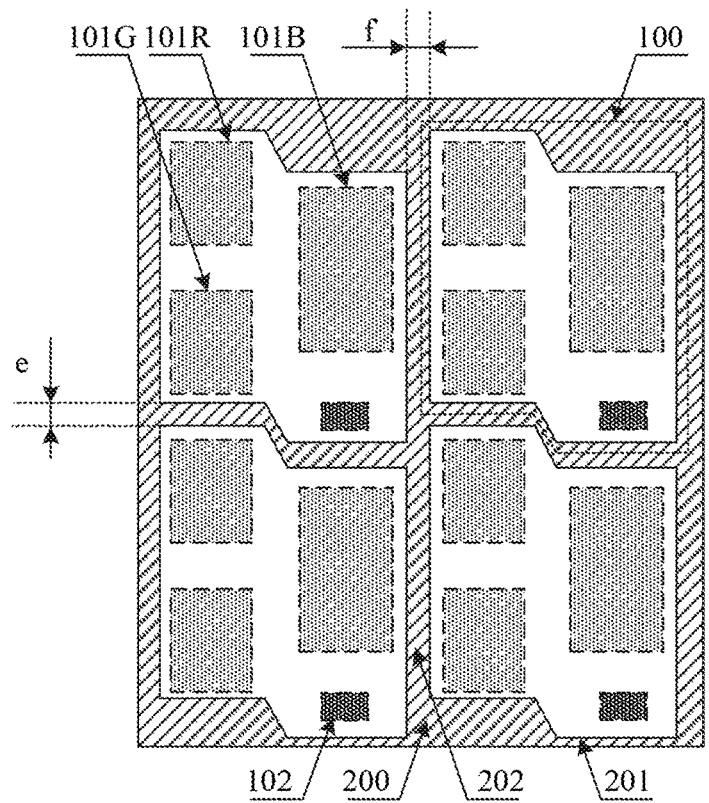
FIG. 5 is a schematic structural diagram of still another touch display panel according to the present disclosure.

FIG. 5 is a schematic structural diagram of still another touch display panel according to the present disclosure. As shown in FIG. 5, other structures of the touch display panel in this embodiment are similar to the corresponding structures described in the foregoing embodiments. Unlike the foregoing embodiments, one hollow region 201 of the touch substrate corresponds to one pixel unit 100 of the display substrate, and an area of the hollow region 201 is greater than or equal to an area of the corresponding pixel unit 100. An orthographic projection of the hollow region 201 on the base substrate contains an orthographic projection of the pixel unit 100 on the base substrate, and one pixel unit 100 includes a red emitting unit 101R, a green emitting unit 101G, a blue emitting unit 101B, and a photo spacer 102.

In an exemplary embodiment, it is set that the area of the hollow region is larger than the area of the corresponding pixel unit, that is, the boundary of the pixel unit is extended outward by a certain distance as the boundary of the hollow region. As shown in FIG. 5, a distance between two hollow regions is e in the column direction, and a distance between two hollow regions is f in the row direction. In an exemplary embodiment, it is set that e is about f, i.e., widths of physical regions between the hollow regions are the same width (about 4 μm to 6 μm). The boundaries of various hollow regions are determined according to the same width. In other words, the determination of the distances by which the boundaries of the pixel units are extended outward and the expansion way are the same as those of the foregoing embodiments, and will not be repeated here.

According to the present disclosure, a hollow region corresponds to one pixel unit and the area of the hollow region is increased, so that the self capacitance of the touch electrode can be further reduced, and the structure of the grid-shaped touch electrode layer can be further simplified.

Figure 6:
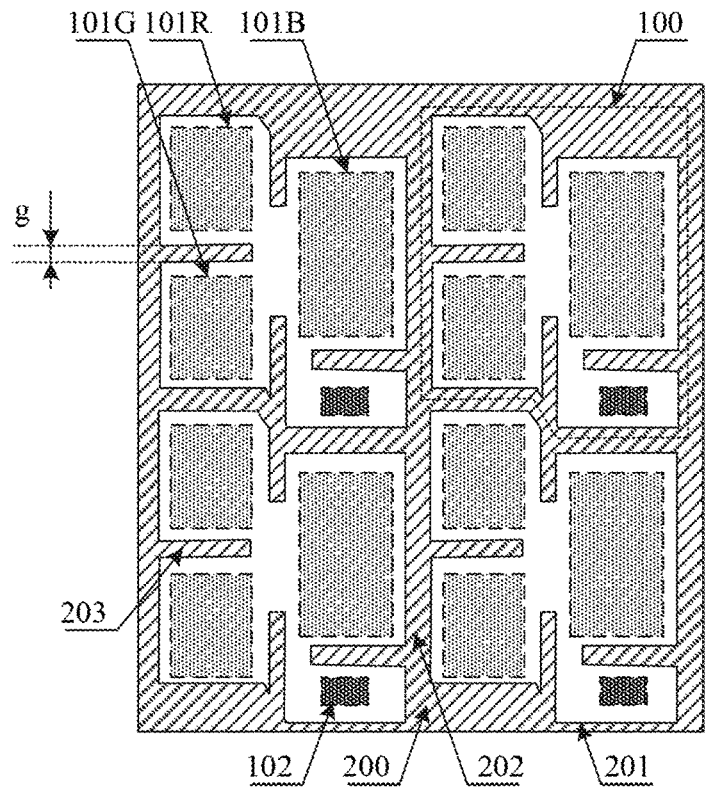
FIG. 6 is a schematic structural diagram of still another touch display panel according to the present disclosure.

FIG. 6 is a schematic structural diagram of still another touch display panel according to the present disclosure. One hollow region 201 of the touch substrate corresponds to one pixel unit 100 of the display substrate, and one pixel unit 100 includes a red emitting unit 101R, a green emitting unit 101G, a blue emitting unit 101B, and a photo spacer 102. As shown in FIG. 6, other structures of the touch display panel in this embodiment are similar to the corresponding structures described in the foregoing embodiments. Unlike the foregoing embodiments, a plurality of shins 203 are formed in each hollow region 201. In an exemplary embodiment, the shin 203 is a physical body extending from an edge of a hollow region to a middle of the hollow region. Each shin 203 is strip-shaped and located between the emitting units 101. One end of the shin 203 is joined with a physical region 202 into a whole, and the other end of the shin 203 extends to the middle of the hollow region in a region between the emitting units 101. The shins seem branches extending from the physical region 202 to the hollow region 201. In an exemplary embodiment, four shins 203 may be formed in each hollow region 201, and the four shins are respectively a branch located at a central position between the red emitting unit 101R and the green emitting unit 101G, a branch located at a central position between the red emitting unit 101R and the blue emitting unit 101B, a branch located at a central position between the green emitting unit 101G and the blue emitting unit 101B and photo spacer 102, and a branch located at a central position between the blue emitting unit 101B and the photo spacer 102. A width g of each shin 203 may be set to be the same, and a length of each shin 203 may be set according to actual needs.

In an exemplary embodiment, it may be set that widths of the physical regions between the hollow regions are the same width (about 4 μm to 6 μm), and the boundaries of various hollow regions are determined according to the same width. In other words, the determination of the distances by which the boundaries of the pixel units are extended outward and the expansion way are the same as those of the foregoing embodiments, and will not be repeated here.

Compared with the foregoing embodiments, an area of a hollow region in this embodiment is close to that of the hollow region in the foregoing embodiments, so the self capacitance of the touch electrode in the foregoing embodiments is roughly equal to the self capacitance of the touch electrode in this embodiment, and the signal-to-noise ratio of the touch response in the foregoing embodiments is roughly equal to the signal-to-noise ratio of the touch response in this embodiment. In an exemplary embodiment, when a touch object (such as a finger) continuously slides over the touch electrode, a plurality of hollow regions may cause interruption of the touch response. By arrangement of a plurality of shins in a hollow region, when a touch object continuously slides over the touch electrode, the shins ensure that the touch object continuously has a certain contact area with the touch electrode, thus the touch response is not only continuous but also linear. Therefore, the present disclosure not only achieves the technical effect of the foregoing embodiments, but also has good response characteristics by arrangement of the plurality of shins in the hollow region.

Figure 7A:
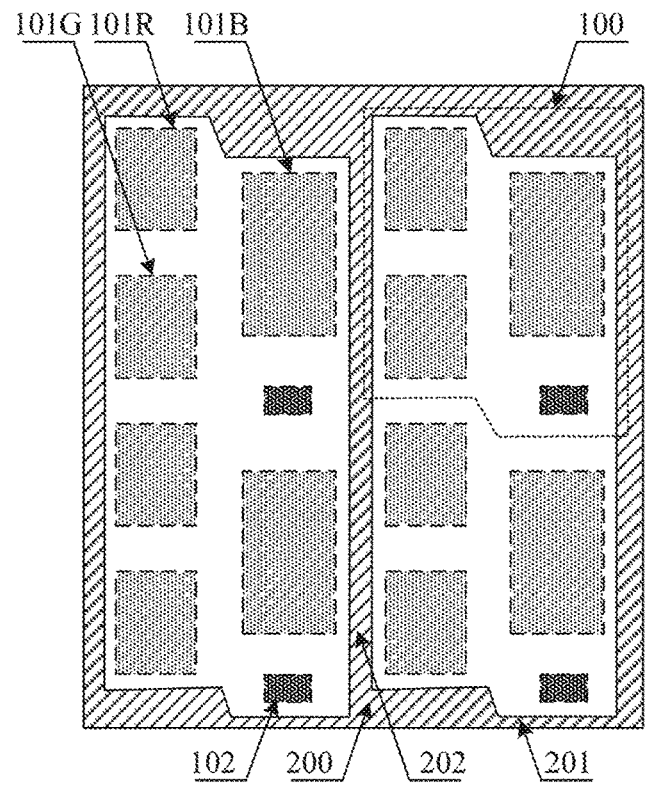
FIGS. 7a and 7b are schematic structural diagrams of still another touch display panel according to the present disclosure.
Figure 7B:
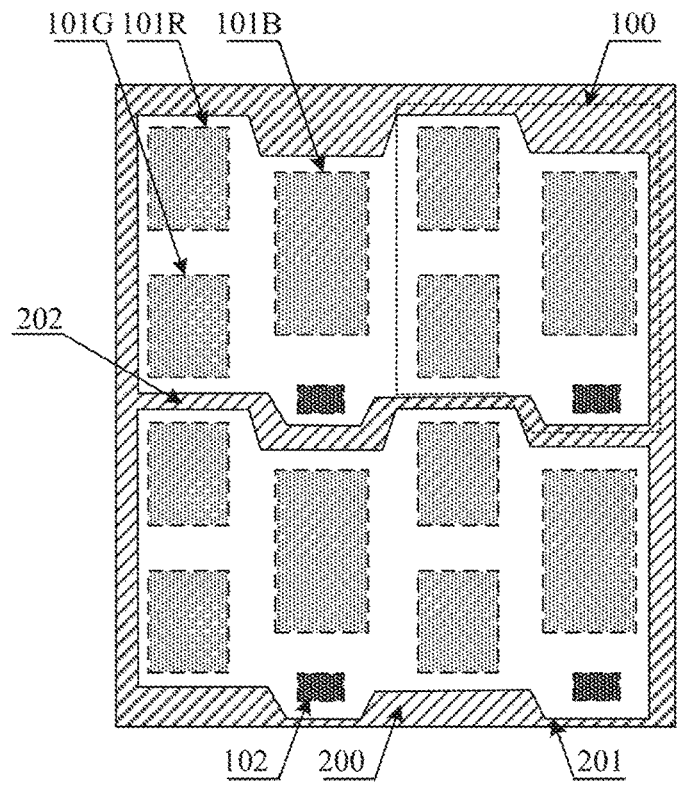

FIG. 7a and FIG. 7b are schematic structural diagrams of still another touch display panel according to the present disclosure. One pixel unit 100 of the display substrate includes a red emitting unit 101R, a green emitting unit 101G, a blue emitting unit 101B, and a photo spacer 102. Other structures of the touch display panel in this embodiment are similar to the corresponding structures described in the foregoing embodiments. Unlike the foregoing embodiments, one hollow region 201 of the touch substrate corresponds to two pixel units 100 of the display substrate. As shown in FIG. 7a, one hollow region 201 corresponds to two pixel units 100 in a column direction. As shown in FIG. 7b, one hollow region 201 corresponds to two pixel units 100 in a row direction.

In an exemplary embodiment, widths of physical regions between the hollow regions are set to be the same width (about 4 μm to 6 μm), and the boundaries of various hollow regions are determined according to the same width. In other words, the determination of the distances by which the boundaries of the pixel units are extended outward and the expansion way are the same as those of the foregoing embodiments. In an exemplary embodiment, a plurality of shins may be formed in each hollow region, which will not be described here.

Figure 8:
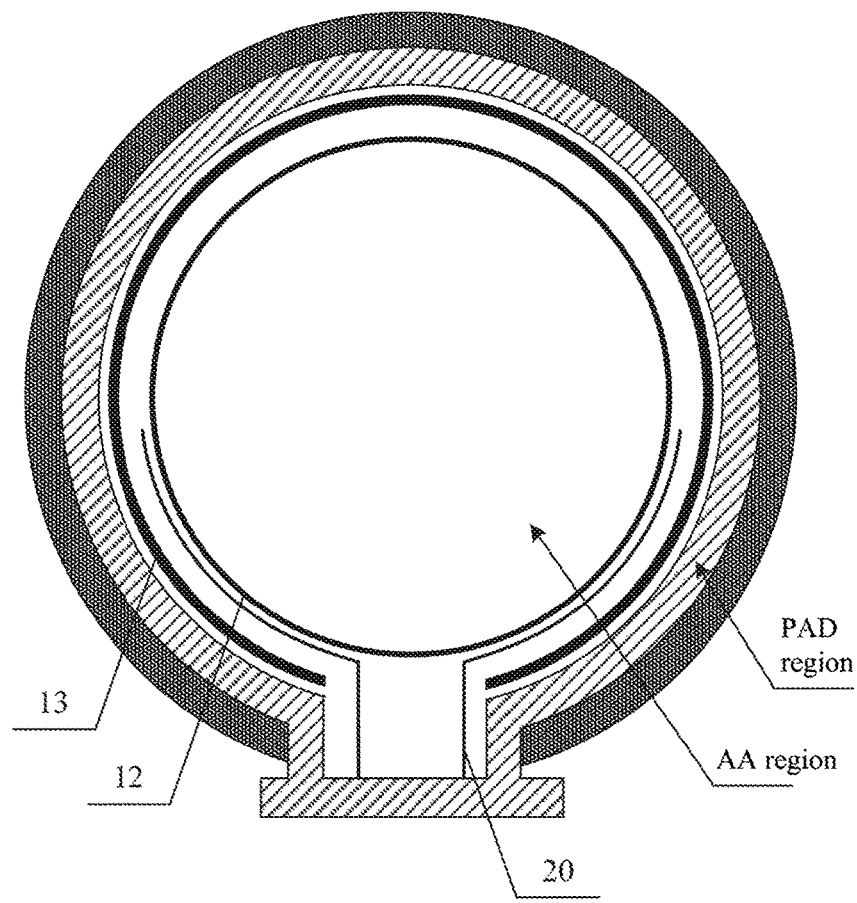
FIG. 8 is a schematic plan view of a display substrate according to the present disclosure.

FIG. 8 is a schematic plan view of a display substrate according to the present disclosure, and illustrates a circular display substrate. A touch display panel includes an active display region (i.e., active area, AA for short) and an overlapping region (i.e., pad area, PAD for short). The active display region AA includes a plurality of pixel units arranged in a matrix, and the overlapping region PAD is located at a periphery of the active display region AA and has a stacked structure. As shown in FIG. 8, in an exemplary embodiment, the display substrate includes a scanning line, a shield line, and a common electrode. The closed scanning line is connected with a chip on film (COF) at the end to transmit touch signals. The chip on film is connected with a peripheral circuit (not shown) to transmit the touch signals to the peripheral circuit for processing. In an exemplary embodiment, the circular touch display panel may be used for a display apparatus of a wearable device, such as a watch with touch and display functions. What is illustrated in FIG. 8 is only an example. In some possible implementations, a shape of the touch display panel may be other shapes such as a square or rectangle, and the touch display panel may include any one or more of the following: a mobile phone, a tablet computer, a television, a display, a notebook computer, a digital photo frame, a navigator and any other product or component with the display function.

Figure 9:
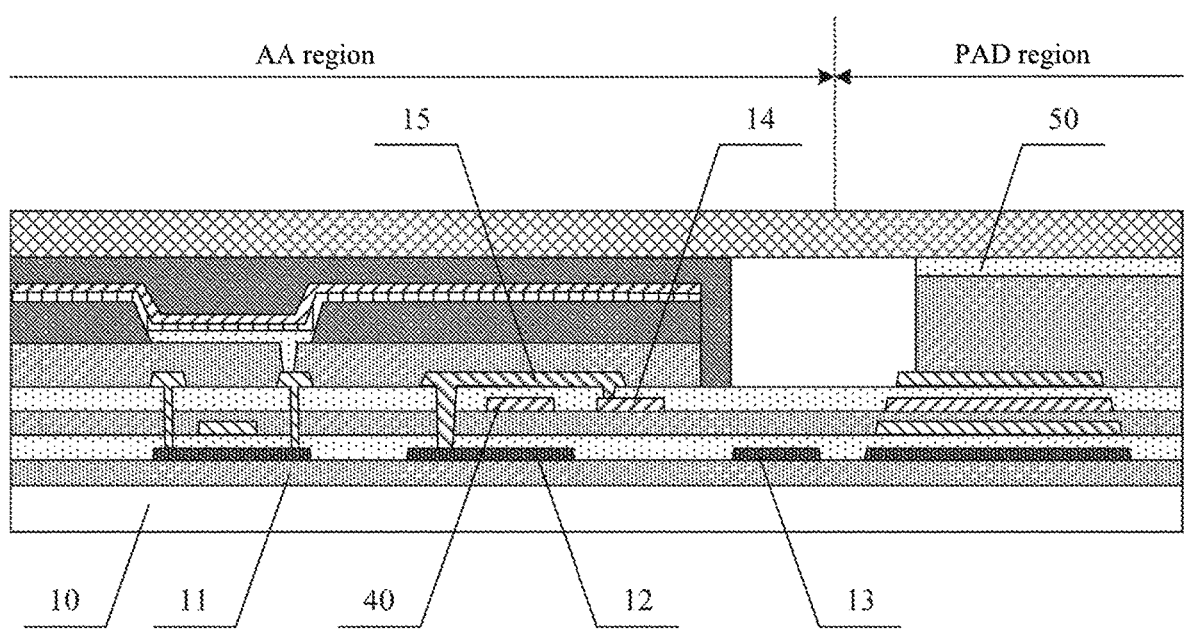
FIG. 9 is a cross-sectional view of a display substrate according to the present disclosure.

FIG. 9 is a cross-sectional view of a display substrate according to the present disclosure, and illustrates a structure of an overlapping region PAD and an active display region AA adjacent to the overlapping region PAD. In an exemplary embodiment, the touch display panel includes a base substrate, a display substrate disposed on the base substrate, and a touch substrate disposed on a surface of a side of the display substrate remote from the base substrate. In an exemplary embodiment, the display substrate may be an organic light-emitting diode (OLED) display panel, and the touch substrate may have a structure shown in any of the foregoing embodiments. The OLED display substrate is a kind of display device packaged and formed by an organic material. The OLED display substrate has the advantages of a low working voltage, a fast response speed, a high luminance efficiency, a wide viewing angle and a wide working temperature, and this is beneficial for a thinning, low power consumption and curved surface design of the display devices. In some possible implementations, the display substrate may be a liquid crystal display (LCD) base substrate.

In an exemplary embodiment, in the active display region AA, the display substrate may include a driving structure layer disposed on the base substrate, emitting units disposed on the driving structure layer, and a packaging layer covering the emitting units, wherein the driving structure layer mainly includes a plurality of thin film transistors (TFTs). In an exemplary embodiment, a thin film transistor may include an active layer disposed on a buffer layer, a first insulating layer covering the active layer, a gate electrode disposed on the first insulating layer, a second insulating layer and third insulating layer covering the gate electrode, and a source electrode and drain electrode disposed on the third insulating layer. The source electrode and the drain electrode are connected with the active layer through vias, respectively. In an exemplary embodiment, an emitting unit may include an anode, an organic emitting layer, and a cathode. The anode is disposed on a fourth insulating layer covering the source electrode and the drain electrode, and is connected with the drain electrode through a via, the organic emitting layer is disposed on the anode, and the cathode is disposed on the organic emitting layer. In an exemplary embodiment, a scanning line may be disposed between the second insulating layer and the third insulating layer.

In an exemplary embodiment, the display substrate is provided with a first shielding layer 12, a second shielding layer 13, a common electrode 14 and a connection electrode 15. The first shielding layer 12 and the second shielding layer 13 may be made of a polycrystalline silicon material, disposed on the same layer as the active layer of the thin film transistor and made of the same material as the active layer of the thin film transistor, and formed by the same patterning process as the active layer of the thin film transistor. The common electrode 14 may be disposed between the second insulating layer and the third insulating layer, and disposed outside the scanning line 40. The connection electrode 15 may be disposed on the same layer, made of the same material, and formed by the same patterning process as the source electrode and drain electrode of the thin film transistor. The connection electrode 15 may be respectively connected with the first shielding layer 12 and the common electrode 14 through vias to form shield to the scanning line 40 so as to reduce interference from external signals on scanning signals output by the scanning line 40.

In an exemplary embodiment, in the overlapping region PAD, the structure of the display substrate is a stacked structure, and the stacked structure includes a plurality of film layers, most of which may be formed in the same patterning process as film layers of the active display region AA. In an exemplary embodiment, the stacked structure of the overlapping region PAD may include a base substrate; a buffer layer disposed on the base substrate, wherein the buffer layer may be formed at the same time as the buffer layer of the active display region AA; a polycrystalline silicon layer disposed on the buffer layer, wherein the polycrystalline silicon layer may be formed at the same time as the active layer of the active display region AA; a first insulating layer covering the polycrystalline silicon layer, wherein the first insulating layer may be formed at the same time as the first insulating layer of the active display region AA; a first metal layer disposed on the first insulating layer, wherein the first metal layer may be formed at the same time as the gate electrode of the active display region AA; a second insulating layer covering the first metal layer, wherein the second insulating layer may be formed at the same time as the second insulating layer of the active display region AA; a second metal layer disposed on the second insulating layer, wherein the second metal layer may be formed at the same time as the scanning line and common electrode of the active display region AA; a third insulating layer covering the second metal layer, wherein the third insulating layer may be formed at the same time as the third insulating layer of the active display region AA; a third metal layer disposed on the third insulating layer, wherein the third metal layer may be formed at the same time as the source electrode, drain electrode and connection electrode of the active display region AA; a flat layer covering the third metal layer; and a contact electrode 50 disposed on the flat layer, wherein the contact electrode may be formed at the same time as the anode of the active display region AA. In an exemplary embodiment, the contact electrode 50 is configured to be electrically connected with the touch substrate to ensure signal connectivity.

The following is an exemplary explanation through a preparation process of the display substrate. The "patterning process" mentioned in the present disclosure includes processes, such as film layer deposition, coating of photoresist, mask exposure, development, etching, and stripping of photoresist. Deposition may be implemented by any one or more of sputtering, evaporation and chemical vapor deposition, coating may be implemented by any one or more of spraying and spin coating, and etching may be implemented by any one or more of dry etching and wet etching, and the present disclosure is not limited thereto. "Thin film" refers to a layer of thin film fabricated by a certain material on a base substrate using deposition or another process. If the "thin film" does not need a patterning process throughout the fabrication process, the "thin film" may also be referred to as a "layer". If the "thin film" needs a patterning process throughout the fabrication process, it is referred to as a "thin film" before the patterning process and as a "layer" after the patterning process. The "layer" that has undergone a patterning process includes at least one "pattern".

First, a buffer layer 11 is formed on a base substrate 10 by deposition, then a polycrystalline silicon layer is formed, and the polycrystalline silicon layer is patterned by a patterning process to form a first polycrystalline silicon layer, a second polycrystalline silicon layer, a third polycrystalline silicon layer and a fourth polycrystalline silicon layer on the buffer layer 11. In an exemplary embodiment, the first polycrystalline silicon layer serves as the active layer of the thin film transistor, the second polycrystalline silicon layer serves as the first shield layer 12 surrounding the active display region AA, the third polycrystalline silicon layer serves as the second shield layer 13 surrounding the first shield layer 12, and the fourth polycrystalline silicon layer is located in the overlapping region PAD.

Next, a first insulating film and a first metal film are sequentially deposited, and the first metal film is patterned through a patterning process to form the first insulating layer, a gate electrode and a first metal layer disposed on the first insulating layer. The first metal layer is located in the overlapping region PAD.

Then, a second insulating film and a second metal film are sequentially deposited, and the second metal film is patterned by a patterning process to form a second insulating layer and a common electrode 14, a scanning line 40 and a second metal layer disposed on the second insulating layer. The second metal layer is located in the overlapping region PAD.

Subsequently, a third insulating film is deposited, and the third insulating film is patterned by a patterning process to form a third insulating layer provided with vias including two first vias exposing the active layer (the first polycrystalline silicon layer), a second via exposing the common electrode 14, and a third via exposing the first shielding layer 12 (the second polycrystalline silicon layer).

After that, a third metal film is deposited, and the third metal film is patterned through a patterning process to form a source electrode, a drain electrode, a connection electrode 15 and a third metal layer on the third insulating layer. The source electrode and the drain electrode are respectively connected with the first polycrystalline silicon layer through two first vias, the connection electrode 15 is connected with the common electrode 14 through the second via, the connection electrode 15 is connected with the first shielding layer 12 through the third via, and the third metal layer is located in the overlapping region PAD.

Subsequently, a fourth insulating layer (a flat layer) is respectively formed in the active display region AA and the overlapping region PAD, a fourth via is provided in the fourth insulating layer of the active display region AA, and the fourth via exposes the drain electrode. Then, another flat layer is formed on the overlapping region PAD, so that a height of the overlapping region PAD is adapted to an overall thickness of the active display region AA.

Subsequently, a transparent conductive film is deposited, the transparent conductive film is patterned through a patterning process to form an anode in the active display region AA and form a contact electrode 50 in the overlapping region PAD. The contact electrode 50 is configured to electrically connect with a touch electrode of the touch substrate.

Then, a pixel define layer, an organic emitting layer, a cathode, and a packaging layer are sequentially formed in the active display region AA. In an exemplary embodiment, photo spacers may be formed after the pixel define layer is formed. In an exemplary embodiment, a thickness of each film layer in the active display region AA is the same as a thickness of each film layer in the overlapping region PAD.

Finally, the touch substrate is disposed on the display substrate, and the touch electrode of the touch substrate is closely overlapped with the contact electrode of the overlapping region PAD of the display substrate to realize reliable electrical connection.

In an exemplary embodiment, the display substrate further includes a packaging region located at the periphery of the overlapping region PAD, and the entire package is realized using a frit printing layer.

According to the present disclosure, the display substrate is provided with the first shielding layer and second shielding layer surrounding the active display region AA, the first shielding layer and the second shielding layer are made of the polycrystalline silicon material with a high resistance, and the display substrate is provided with the common electrode which is connected with the first shielding layer through the connection electrode to form a shield to the scanning line, thereby interference from external signals on scanning signals output by the scanning line is effectively reduced, the scanning signals are better protected, and the signal-to-noise ratio of touch response is further improved. As the first shielding layer, the second shielding layer and the active layer of the thin film transistor are simultaneously formed through the same patterning process, the common electrode and the scanning line are simultaneously formed through the same patterning process, the connection electrode and the source electrode and drain electrode of the thin film transistor are simultaneously formed through the same patterning process, no additional processes are needed in the preparation process, the process compatibility is good, and the process practicability is strong.

Figure 10:
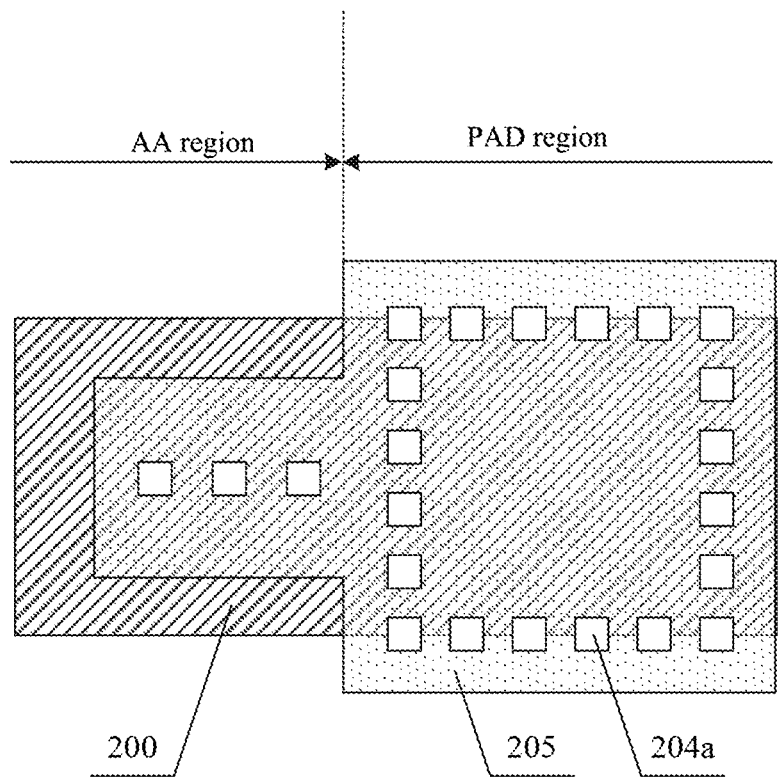
FIG. 10 is a schematic plan view of a touch substrate according to the present disclosure.
Figure 11:
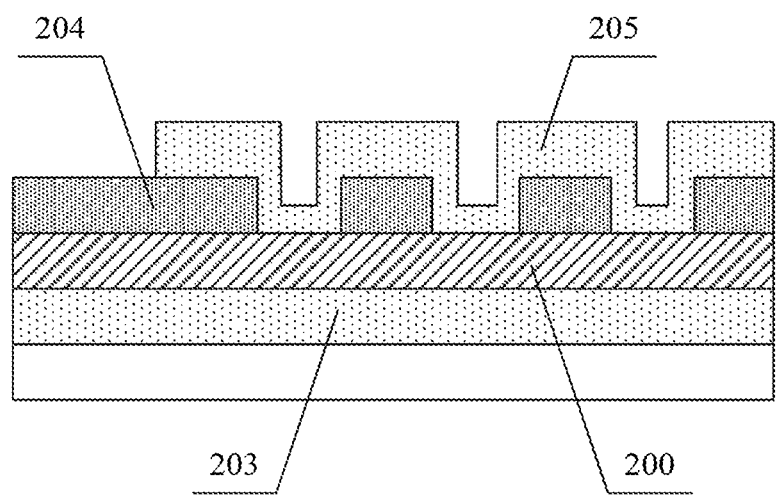
FIG. 11 is a cross-sectional view of a touch substrate according to the present disclosure.

FIG. 10 is a schematic plan view of a touch substrate according to the present disclosure, and FIG. 11 is a sectional-view of the touch substrate according to the present disclosure. As shown in FIGS. 10 and 11, the touch substrate includes a touch base substrate, an index margin (IM) layer 203 disposed on the touch base substrate, a touch electrode layer 200 disposed on the IM layer 203, a touch insulating layer 204 disposed on the touch electrode layer 200, and a touch contact electrode layer 205 disposed on the touch insulating layer 204, and most of the touch contact electrode layer 205 is disposed in the overlapping region PAD, and a small portion of the touch contact electrode layer 205 is disposed in a region adjacent to the overlapping region PAD in the active display region AA. In an exemplary embodiment, the touch electrode layer 200 may be made of molybdenum (Mo) or aluminum (Al), the touch insulating layer 204 may be made of silicon oxide (SiOx) or silicon nitride (SiNx), and the touch contact electrode layer 205 may be made of indium tin oxide (ITO) or indium zinc oxide (IZO).

Researches found that when the touch substrate is mounted on the display substrate and the touch contact electrode layer on the touch substrate is in contact connection with the contact electrode on the display substrate, due to a large overlapping area, the overlapping area is about 40 μm2-200 μm2, the indium tin oxide ITO will release certain gas and stress, which will affect the adhesion of the two contact electrodes and further affect the reliability of the electrical connection of the two contact electrodes. For such reason, the present disclosure proposes a solution to eliminate gas and stress.

As shown in FIGS. 10 and 11, in the touch substrate of the present disclosure, the touch insulating layer 204 is provided with a plurality of vias 204a. By arrangement of the plurality of vias 204a, on one hand, the touch contact electrode layer 205 is connected with the touch electrode layer 200 through vias 204a, and on the other hand, certain gas and stress can be released when the touch contact electrode layer 205 is overlapped with the contact electrode of the display substrate. This makes two contact electrodes preferably adhered to ensure the reliability of electrical connection of the two contact electrodes. In an exemplary embodiment, the vias provided in the active display region AA can be used for connecting the touch contact electrode layer 205 with the touch electrode layer 200 through the vias 204a, and the vias 204a provided in the overlapping region PAD can be used for releasing gas and stress, so a plurality of vias 204a in the overlapping region PAD are disposed at surrounding edges of the overlapping region PAD, and the plurality of vias 204a form an annular via region, which can effectively improve the efficiency of releasing gas and stress. In an exemplary embodiment, the quantity and positions of vias may be designed according to actual needs. Since the plurality of vias in the overlapping region PAD can be simultaneously prepared through the same process as vias provided in the active display region AA, the solution provided by the present disclosure does not need to add additional processes and has good process compatibility.

The present disclosure further provides a method for preparing a touch display panel. In an exemplary embodiment, the method for preparing the touch display panel may include: forming a display substrate including a plurality of pixel units arranged in a matrix on a base substrate, and forming a touch substrate including a touch electrode layer; wherein in an exemplary embodiment, the pixel units each includes a plurality of sub-pixels, and the touch electrode layer includes a plurality of hollow regions; and disposing the touch substrate on the display substrate, so that an orthographic projection of a hollow region on the base substrate contains an orthographic projection of at least one sub-pixel on the base substrate, or an orthographic projection of a hollow region on the base substrate contains an orthographic projection of at least one pixel unit on the base substrate.

In an exemplary embodiment, the formed display substrate may include a plurality of photo spacers, and when the touch substrate is disposed on the display substrate, an orthographic projection of a hollow region on the base substrate further contains an orthographic projection of a photo spacer on the base substrate.

In an exemplary embodiment, at least one shin may be disposed in the hollow region, and the at least one shin is a strip-shaped physical body extending from an edge of the hollow region to a middle of the hollow region.

In an exemplary embodiment, forming the display substrate including the plurality of pixel units arranged in the matrix on the base substrate may include: forming, on the base substrate, a thin film transistor, a scanning line, a shielding layer surrounding an active display region, and a common electrode connected with the shielding layer through a connection electrode, wherein the shielding layer, the connection electrode and the common electrode form shield to the scanning line.

In an exemplary embodiment, forming, on the base substrate, the thin film transistor, the scanning line, the shielding layer surrounding the active display region, and the common electrode connected with the shielding layer through the connection electrode may include: forming, on the base substrate, an active layer of the thin film transistor, a first shielding layer surrounding the active display region and a second shielding layer surrounding the first shielding layer through a same patterning process; forming a first insulating layer covering the active layer, the first shielding layer and the second shielding layer, and a gate electrode disposed on the first insulating layer; forming a second insulating layer covering the gate electrode, and the common electrode and the scanning line disposed on the second insulating layer; forming a third insulating layer covering the common electrode and the scanning line, wherein the third insulating layer is provided with a first via exposing the active layer, a second via exposing the common electrode and a third via exposing the first shielding layer; and forming a source electrode, a drain electrode and a connection electrode on the third insulating layer, wherein the source electrode and the drain electrode are respectively connected with the active layer through the first via, the connection electrode is connected with the common electrode through the second via, and the connection electrode is connected with the first shielding layer through the third via.

In an exemplary embodiment, forming the touch substrate including the touch electrode layer may include: forming the touch electrode layer including the plurality of hollow regions on a touch base substrate, wherein a material of the touch electrode layer includes molybdenum or aluminum; forming a touch insulating layer on the touch electrode layer, wherein the touch insulating layer is provided with a plurality of vias, and the plurality of vias are configured to release gas and stress when a touch contact electrode layer is overlapped with a contact electrode of the display substrate; and forming the touch contact electrode layer on the touch insulating layer, wherein the touch contact electrode layer is connected with the touch electrode layer through the plurality of vias.

The specific preparation process and the formed structure of the touch display panel have been described in detail above, and will not be repeated here.

In the description of the present disclosure, it should be understood that azimuth or positional relationships indicated by terms "middle", "upper", "lower", "front", "rear", "vertical", "horizontal", "top", "bottom", "inside", "outside" and the like is based on the azimuth or positional relationship shown in the drawings, which is only for ease of description of the present disclosure and simplification of the description, rather than indicating or implying that the device or element referred to must have a specific orientation, or must be constructed and operated in a particular orientation, and therefore cannot be construed as limiting the present disclosure.

In the description of the present disclosure, it should be understood that unless otherwise clearly specified and defined, the terms "install", "connect", "link", "fix" and other terms should be broadly interpreted, for example, it may be connected fixedly or connected detachably, or integrated; it may be a mechanical connection or an electrical connection; it may be directly connected, or may be indirectly connected through an intermediary, it may be an internal connection between two elements or an interaction between two elements, unless otherwise clearly specified. Those of ordinary skilled in the art can understand the specific meanings of the above terms in the present disclosure according to specific situations.

Although embodiments of the present disclosure are described in the above, the above embodiments are described only for better understanding, rather than restricting the present disclosure. Any person skilled in the field to which the present disclosure pertains can make any modifications and variations in the forms and details of implementation without departing from the spirit and the scope disclosed in the present disclosure, but the patent protection scope of the present application should still be subject to the scope defined by the appended claims.

What we claim is:

1. A touch display panel, comprising a base substrate, a display substrate disposed on the base substrate, and a touch substrate disposed on the display substrate, wherein the display substrate comprises a plurality of pixel units arranged in a matrix, the pixel units each comprise a plurality of sub-pixels, the touch substrate comprises a touch electrode layer, the touch electrode layer comprises a plurality of hollow regions, and an orthographic projection of a hollow region on the base substrate contains an orthographic projection of at least one sub-pixel on the base substrate, or an orthographic projection of a hollow region on the base substrate contains an orthographic projection of at least one pixel unit on the base substrate;
wherein the display substrate comprises a thin film transistor, a scanning line, a shielding layer surrounding an active display region, and a common electrode connected with the shielding layer through a connection electrode, which are disposed on the base substrate, and the shielding layer, the connection electrode and the common electrode form shield to the scanning line.

2. The touch display panel according to claim 1, wherein the display substrate further comprises a plurality of photo spacers, and an orthographic projection of a hollow region on the base substrate contains an orthographic projection of a photo spacer on the base substrate.

3. The touch display panel according to claim 2, wherein a distance between a boundary of the orthographic projection of the hollow region on the base substrate and a boundary of the orthographic projection of the at least one sub-pixel, the at least one pixel unit or the photo spacer on the base substrate is about 5 µm to 8 µm.

4. The touch display panel according to claim 2, wherein the touch electrode layer further comprises a physical region located between the hollow regions, and a width of the physical region is about 4 µm to 6 µm.

5. The touch display panel according to claim 1, further comprising at least one shin being disposed in the hollow region, the at least one shin being a strip-shaped physical body extending from an edge of the hollow region to a middle of the hollow region.

6. The touch display panel according to claim 5, wherein four shins are disposed in the hollow region, the four shins being respectively located between adjacent emitting units and between an emitting unit and a photo spacer.

7. The touch display panel according to claim 1, wherein a material of the touch electrode layer comprises any one or more of molybdenum and aluminum.

8. The touch display panel according to claim 1, wherein the shielding layer comprises a first shielding layer surrounding the active display region, and a second shielding layer surrounding the first shielding layer, and the first shielding layer is connected with the common electrode through the connection electrode.

9. The touch display panel according to claim 8, wherein a material of the first shielding layer and the second shielding layer comprises polycrystalline silicon, and the first shielding layer and the second shielding layer are disposed on a same layer as an active layer of the thin film transistor, and the material of the first shielding layer and the second shielding layer is same as that of the thin film transistor.

10. A touch display panel, comprising a base substrate, a display substrate disposed on the base substrate, and a touch substrate disposed on the display substrate, wherein the display substrate comprises a plurality of pixel units arranged in a matrix, the pixel units each comprise a plurality of sub-pixels, the touch substrate comprises a touch electrode layer, the touch electrode layer comprises a plurality of hollow regions, and an orthographic projection of a hollow region on the base substrate contains an orthographic projection of at least one sub-pixel on the base substrate, or an orthographic projection of a hollow region on the base substrate contains an orthographic projection of at least one pixel unit on the base substrate;
wherein the display substrate comprises a thin film transistor, a scanning line, a shielding layer surrounding an active display region, and a common electrode connected with the shielding layer through a connection electrode, which are disposed on the base substrate, and the shielding layer, the connection electrode and the common electrode form shield to the scanning line;
wherein the touch substrate further comprises a touch insulating layer disposed on the touch electrode layer and a touch contact electrode layer disposed on the touch insulating layer, the touch insulating layer is provided with a plurality of vias, and the plurality of vias are configured to connect the touch contact electrode layer with the touch electrode layer, and are further configured to release gas and stress when the touch contact electrode layer is overlapped with a contact electrode of the display substrate.

11. The touch display panel according to claim 10, wherein vias provided in an active display region are configured to connect the touch contact electrode layer with the touch electrode layer, and vias provided in an overlapping region are configured to release gas and stress when the touch contact electrode layer is overlapped with the contact electrode of the display substrate; and a plurality of vias in the overlapping region are disposed around the overlapping region, and the plurality of vias form an annular via region.

12. A method for preparing a touch display panel, comprising:
forming a display substrate comprising a plurality of pixel units arranged in a matrix on a base substrate, and forming a touch substrate comprising a touch electrode layer; wherein the pixel units each comprises a plurality of sub-pixels, and the touch electrode layer comprises a plurality of hollow regions; and disposing the touch substrate on the display substrate, an orthographic projection of a hollow region on the base substrate containing an orthographic projection of at least one sub-pixel on the base substrate, or an orthographic projection of a hollow region on the base substrate containing an orthographic projection of at least one pixel unit on the base substrate;

wherein forming the display substrate comprising the plurality of pixel units arranged in the matrix on the base substrate comprises:

forming, on the base substrate, a thin film transistor, a scanning line, a shielding layer surrounding an active display region, and a common electrode connected with the shielding layer through a connection electrode, wherein the shielding layer, the connection electrode and the common electrode form shield to the scanning line.

13. The method for preparing the touch display panel according to claim 12, wherein the formed display substrate further comprises a plurality of photo spacers, and when the touch substrate is disposed on the display substrate, an orthographic projection of a hollow region on the base substrate further contains an orthographic projection of a photo spacer on the base substrate.

14. The method for preparing the touch display panel according to claim 12, wherein at least one shin are disposed in the hollow region, the at least one shin being a strip-shaped physical body extending from an edge of the hollow region to a middle of the hollow region.

15. The method for preparing the touch display panel according to claim 14, wherein four shins are disposed in the hollow region, the four shins being respectively located between adjacent emitting units and between an emitting unit and a photo spacer.

16. The method for preparing the touch display panel according to claim 12, wherein forming, on the base substrate, the thin film transistor, the scanning line, the shielding layer surrounding the active display region, and the common electrode connected with the shielding layer through the connection electrode comprises:

forming, on the base substrate, an active layer of the thin film transistor, a first shielding layer surrounding the active display region and a second shielding layer surrounding the first shielding layer through a same patterning process;

forming a first insulating layer covering the active layer, the first shielding layer and the second shielding layer, and a gate electrode disposed on the first insulating layer;

forming a second insulating layer covering the gate electrode, and the common electrode and the scanning line disposed on the second insulating layer;

forming a third insulating layer covering the common electrode and the scanning line, wherein the third insulating layer is provided with a first via exposing the active layer, a second via exposing the common electrode and a third via exposing the first shielding layer; and forming a source electrode, a drain electrode and a connection electrode on the third insulating layer, wherein the source electrode and the drain electrode are respectively connected with the active layer through the first via, the connection electrode is connected with the common electrode through the second via, and the connection electrode is connected with the first shielding layer through the third via.

17. The method for preparing the touch display panel according to claim 12, wherein forming the touch substrate comprising the touch electrode layer comprises:

forming the touch electrode layer comprising the plurality of hollow regions on a touch base substrate, wherein a material of the touch electrode layer comprises molybdenum or aluminum;

forming a touch insulating layer on the touch electrode layer, wherein the touch insulating layer is provided with a plurality of vias, and the plurality of vias are configured to release gas and stress when a touch contact electrode layer is overlapped with a contact electrode of the display substrate; and forming the touch contact electrode layer on the touch insulating layer, wherein the touch contact electrode layer is connected with the touch electrode layer through the plurality of vias.

18. The method for preparing the touch display panel according to claim 17, wherein vias formed in an active display region are configured to connect the touch contact electrode layer with the touch electrode layer, and vias formed in an overlapping region are configured to release gas and stress when the touch contact electrode layer is overlapped with the contact electrode of the display substrate; and a plurality of vias in the overlapping region are formed around the overlapping region, and the plurality of vias form an annular via region.

* * * * *